United States Patent
Tsai et al.

(10) Patent No.: US 7,085,698 B2
(45) Date of Patent: Aug. 1, 2006

(54) METHOD FOR PROVIDING FLEXIBLE AND DYNAMIC REPORTING CAPABILITY USING SIMULATION TOOLS

(75) Inventors: Chi-Ming Tsai, Palo Alto, CA (US); Shao-Po Wu, Portola Valley, CA (US)

(73) Assignee: Synopsys, Inc., Mountain View, CA (US)

( * ) Notice: Subject to any disclaimer, the term of this patent is extended or adjusted under 35 U.S.C. 154(b) by 738 days.

(21) Appl. No.: 10/025,414

(22) Filed: Dec. 18, 2001

(65) Prior Publication Data

US 2003/0115034 A1 Jun. 19, 2003

(51) Int. Cl.
*G06F 17/50* (2006.01)

(52) U.S. Cl. ............... 703/13; 703/14; 703/1; 716/9; 716/10

(58) Field of Classification Search .......... 703/14, 703/15; 716/11, 9, 10
See application file for complete search history.

(56) References Cited

U.S. PATENT DOCUMENTS

| | | | |
|---|---|---|---|
| 5,694,481 A * | 12/1997 | Lam et al. ............ 382/145 |
| 5,801,954 A | 9/1998 | Le et al. ............... 364/488 |
| 5,838,583 A * | 11/1998 | Varadarajan et al. ...... 716/9 |
| 5,974,243 A | 10/1999 | Moh et al. .......... 395/500.03 |
| 6,045,584 A | 4/2000 | Benzel et al. .......... 716/11 |
| 6,077,307 A | 6/2000 | Benzel et al. ........... 716/2 |
| 6,081,659 A | 6/2000 | Garza et al. ........ 395/500.22 |
| 6,115,546 A * | 9/2000 | Chevallier et al. ....... 716/5 |
| 6,263,301 B1 * | 7/2001 | Cox et al. ............ 703/14 |
| 6,301,689 B1 * | 10/2001 | Darden .............. 716/5 |
| 6,370,679 B1 * | 4/2002 | Chang et al. ........... 716/19 |
| 6,415,421 B1 * | 7/2002 | Anderson et al. ........ 716/4 |
| 6,425,113 B1 * | 7/2002 | Anderson et al. ........ 716/4 |
| 6,467,076 B1 * | 10/2002 | Cobb .................. 716/19 |
| 6,470,489 B1 * | 10/2002 | Chang et al. ........... 716/21 |
| 6,523,162 B1 * | 2/2003 | Agrawal et al. .......... 716/19 |
| 6,560,766 B1 * | 5/2003 | Pierrat et al. ............ 716/19 |
| 6,578,188 B1 * | 6/2003 | Pang et al. ............. 716/19 |
| 6,584,609 B1 * | 6/2003 | Pierrat et al. ............ 716/19 |
| 6,637,013 B1 * | 10/2003 | Li .................... 716/5 |
| 6,757,645 B1 * | 6/2004 | Chang et al. ........... 703/13 |
| 2003/0061583 A1 * | 3/2003 | Malhotra ............... 716/5 |

FOREIGN PATENT DOCUMENTS

| | | |
|---|---|---|
| WO | WO 99/14638 A1 | 3/1999 |
| WO | WO 00/67075 A1 | 11/2000 |
| WO | WO 00/67076 A1 | 11/2000 |

OTHER PUBLICATIONS

Lavenir, "Lavenir CAM Software User's Guide", 1999, pp. 115-130, 385-412.*
A.B. Kahng and Y.C. Pati, "Subwavelength Optical Lithography: Challenges and Impact on Physical Design", 1999, ACM, pp. 112-119.*

(Continued)

*Primary Examiner*—Paul L. Rodriguez
*Assistant Examiner*—Jason Proctor
(74) *Attorney, Agent, or Firm*—Bever Hoffman & Harms, LLP; Jeanette S. Harms

(57) ABSTRACT

A method of generating simulation reports regarding an integrated circuit layout is provided. The method can include providing a plurality of control points associated with the integrated circuit layout. A single simulation of the plurality of control points can be performed. Detailed information from the single simulation can be stored in a database. Desired information can then be extracted from the database to generate the simulation reports.

16 Claims, 3 Drawing Sheets

OTHER PUBLICATIONS

E. Sahouria, Y. Granik, N. Cobb, and O. Toublan; "Full-chip Process Simulation for Silicon DRC"; 2000, MSM 2000, pp. 1-4.*

Frank M Schellenberg, "Resolution Enhancement with OPC/PSM", Jan. 2000, pp. 1-16.*

Cai, L., et al., "Enhanced Dispositioning of Reticle Defects Using the Virtual Stepper with Automated Defect Severity Scoring", Numerical Technologies, Inc., Advanced Micro Devices. Inc., pp. 1-12.

Ronsc. K., et al., "Thin Film Interference Effects in Phase Shifting Masks Causing Phase and Transmittance Errors", IMEC (15 pages).

Casey, Jr., J.D., et al., "Chemically Enhanced FIB Repair of Opaque Defects on Molybdenum Silicide Photomasks", SPIE, vol. 3236, pp. 487-497 (1997).

Henke, W., et al., "A Study of Reticle Defects Imaged Into Three-Dimensional Developed Profiles of Positive Photoresist Using the Solid Lithography Simulator", Microelectronics Eng., vol. 14, pp. 283-297 (1991).

Ham, Y.M., et al., "Dependence of Defects in Optical Lithography", Jpn. J. Appl. Phys., vol. 31, pp. 4137-4142 (1992).

Watanabe, H., et al., "Detection and Printability of Shifter Defects in Phase-Shifting Masks II Defocus Characteristics", Jpn. J. Appl. Phys., vol. 31, pp. 4155-4160 (1992).

Nistler, J., et al., "Phase Shift Mask Defect Printability Analysis", Proceedings Of The Microlithography Seminar INTERFACE '93. OCG Microelectronic Materials, Inc., pp. 11-28 (1993).

Spence, C., et al., "Automated Determination of CAD Layout Failures Through Focus: Experiment and Simulation", SPIE, vol. 2197, pp. 302-313 (1994).

Karklin, L., "A Comprehensive Simulation Study of the Photomask Defects Printability", SPIE, vol. 2621. pp. 490-504 (1995).

Gans, F., et al., "Printability and Repair Techniques for DUV Photomasks", SPIE, Proceedings Of The 17th Annual Symposium On Photomask Technology And Management, vol. 3236. pp. 136-141 (1997).

Ibsen, K., et al., "Clear Field Reticle Defect Diposition for Advanced Sub-Half Micron Lithography", SPIE, Proceedings Of The 17th Annual Symposium on Photomask Technology And Management. vol. 3236, pp. 124-135 (1997).

Tsujimoto, E., et al., "Hierarchical Mask Data Design System (PROPHET) for Aerial Image Simulation, Automatic Phase-Shifter Placement, and Subpeak Overlap Checking", SPIE, vol. 3096, pp. 163-172 (1997).

Gordon, R., et al., "Design and Analysis of Manufacturable Alternating Phase-Shifting Masks", Bacus News, vol. 14, Issue 12, pp. 1-9, Dec. 1998.

Chen, et al., "ArF (193nm) Alternating PSM Quartz Defect Repair and Printability for 100nm Node", BACUS Photomask Technology, Sep. 21, 2001 (20 pages).

* cited by examiner

Main Table 300

| Control Point | Cell Name | Type | Rule Id | Location | Deviation | Angle |
|---|---|---|---|---|---|---|
| 301 | | | | | | |
| 302 | | | | | | |
| 303 | | | | | | |
| 304 | | | | | | |

Figure 3

Stat Table 400

| | Mean | Sum of Squares of Deviations | Variance | Standard Deviation |
|---|---|---|---|---|
| Cell Name | | | | |
| Type | | | | |
| Rule Id | | | | |

Figure 4

Cell Table 500

| Cell Name | Number of Control Points | Simulation Time |
|---|---|---|
| Cell 501 | | |
| Cell 502 | | |
| Cell 503 | | |

METHOD FOR PROVIDING FLEXIBLE AND DYNAMIC REPORTING CAPABILITY USING SIMULATION TOOLS

BACKGROUND OF THE INVENTION

1. Field of the Invention

The invention relates to simulation tools, and particularly to storing detailed deviation information from a simulated layout, thereby facilitating flexible and dynamic reporting capability.

2. Discussion of the Related Art

In sub-wavelength designs, traditional design rule checking (DRC) tools cannot be relied upon as a final check for silicon manufacturability. Specifically, because features can be distorted during the sub-wavelength manufacturing process due to both local and global proximity effects, DRC tools cannot provide the coverage and assurance needed for silicon sign-off.

To resolve this problem, certain simulation tools have been provided that can verify the layout of a sub-wavelength integrated circuit compared to the printed wafer. Numerical Technologies, Inc. licenses such a tool, the SiVL® software package. This simulation tool can read in a user's layout and then simulate lithographic processes and conditions. The resulting simulated wafer image can be compared to the user's layout.

Prior to this comparison step, the user is generally prompted to designate a tolerance, i.e. a maximum acceptable deviation, from the user's original layout. In one embodiment, the simulation tool can generate a graphical output including the original layout with contours showing the simulated wafer image. An area of the layout exceeding the tolerance can be marked with a graphical symbol, such as a "+" or "■". See, for example, U.S. patent application Ser. No. 09/960,669, filed on Sep. 21, 2001 by Numerical Technologies, Inc. Understanding where tolerance violations occur can indicate problems with the design or perhaps errors in providing rule parameters. However, setting a zero-tolerance can result in a large number of tolerance violations throughout the layout. Thus, setting the tolerance too tight generates too much information for a useful user review. Moreover, the appropriate tolerance can vary significantly from one design to another design. Therefore, determining an appropriate tolerance that can provide useful simulation results is frequently a trial and error process.

Unfortunately, a new tolerance cannot leverage the results of a previous simulation. Specifically, setting a new tolerance requires repeating the simulation, thereby wasting considerable resources. For example, a medium-sized integrated circuit layout may take between 12 and 24 hours to simulate. Thus, the simulation tool is inefficiently used to re-run simulations on the same design rather than running new designs. Moreover, after this long process time, the user analysis done for proposing that specific tolerance may not be retained, thereby requiring further analysis. Thus, user time is also wasted on one design.

Therefore, a need arises for minimizing inefficient resource allocation by improving the simulation process. A further need arises for providing flexible and dynamic reporting capability to the user.

SUMMARY OF THE INVENTION

In accordance with one feature of the invention, a user can extract information from a database, which is generated by a one-time simulation of the user's layout. Specifically, designated control point information (e.g. a type, a rule identification, a tolerance, and a target parameter) and detailed deviation information regarding control points on the layout can be stored in the database. The user can tailor various reporting formats to provide the information most pertinent to that user.

Advantageously, based on the database, a user can easily change information regarding the rule identification, tolerance, and target parameter and still generate valid reports. Because a simulation on a layout need only be done once and accessing a database is significantly faster than simulating a layout, these reports can be expeditiously generated. This flexible and dynamic reporting capability provides the user with a rich source of information regarding the layout, thereby allowing that user to make better-informed decisions on correcting the layout.

In one embodiment, storing information can include organizing the control point information in a main table, a statistics table, and/or a cell table. Extracting desired information can include creating a temporary table for that information. The user can view the extracted information in a sequential browse mode, a view by area mode, a histogram mode, an error count mode, and/or a GDS mode. In one embodiment, at least one new rule associated with the control points can be provided. Additional reports can then be generated based on the new rule(s) and the single simulation. Because the user can generate the reports using the new rule without performing another simulation, the user can save considerable time and can more efficiently use tool resources.

A database for reporting results from simulating a layout is also provided. The database can include a plurality of control points associated with the layout, designated information regarding the plurality of control points, and deviation information regarding the plurality of control points. Advantageously, the deviation information can include a magnitude as well as an environment for each control point, e.g. spacing within or outside a feature of the layout. The designated information can includes the type, the rule identification, the tolerance, and the target parameter for each control point. In one embodiment, the designated information and the deviation information can be organized in the main table, the statistics table, and/or the cell table.

A method of generating simulation reports regarding a layout is also provided. The method can include dissecting feature edges on the layout into segments, wherein each segment can include a control point. Of importance, a single simulation of the layout can be performed using the control points. Information from the single simulation can be stored in a database. User-identified information can then be extracted from the database to generate the simulation reports.

BRIEF DESCRIPTION OF THE DRAWINGS

FIG. 3 illustrates an exemplary main table in which each row corresponds to a control point whose deviation is greater than the tolerance.

FIG. 4 illustrates an exemplary statistics table in which the selected group of control points could be in a cell, of a specific type, or designated by a rule identification.

FIG. 5 illustrates an exemplary cell table, which provides information regarding specific cells in the layout.

DETAILED DESCRIPTION OF THE DRAWINGS

Figure 1:
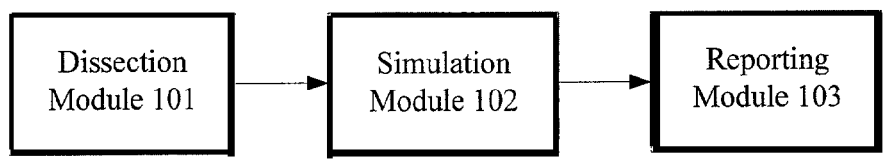
FIG. 1 illustrates a simulation tool including a dissection module, a simulation module, and a reporting module.

FIG. 1 illustrates a simulation tool in accordance with the invention that includes three main modules: a dissection module 101, a simulation module 102, and a reporting module 103. These modules can be optimized to provide flexible and dynamic reporting capability to a user.

Dissection Module

Although the complex patterns of an IC layout may seem to be made up of fine lines, even the thinnest of lines are actually two-dimensional elements. As such, these elements can be represented by a series of contiguous edges that are joined to other edges at distinct corners. The contiguous edges and their associated corners define the features on the layout.

During an operation performed by dissection module 101, the edges of the features on the layout are divided into segments. In one embodiment, dissection module 101 can generate those segments by using one or more user-defined segment lengths. For example, a user could indicate that all segments should be substantially 120 nm long. In another example, the user could indicate that edges near a corner should be divided into segments 60 nm long. Note that the user could define the segment length(s) by using a graphical user interface (GUI) provided by the dissection module or by using another input method (such as via a technology file or a script). In another embodiment, the segment lengths can be automatically generated by dissection module 101, wherein the module-generated segment lengths can be used instead of, or in combination with, the user-defined segment lengths.

After dissection, each segment can be designated using an associated control point (sometimes located at the mid-point of the segment). By using a control point, a tool can efficiently operate on its associated segment. Specifically, operations performed on a control point affect its associated segment in a similar manner. For example, if the control point is biased in an optical proximity correction (OPC) operation by a distance X, then its associated segment is also biased by distance X.

Dissection module 101 can characterize a control point by its "type". In one embodiment, the "type" of point can be identified by the shape of its associated segment, wherein a shape is defined as a set of associated edges. In one embodiment, a shape engine (provided in operative relation to dissection module 101) can include a catalog of defined shapes having contiguous or non-contiguous edge profiles. The shape engine can consider various properties inherent in a particular edge including length, inner color, outer color, spacing, beginning angle, and ending angle among others, to characterize the control point. In another embodiment, the user can program the number of types.

Figure 2:
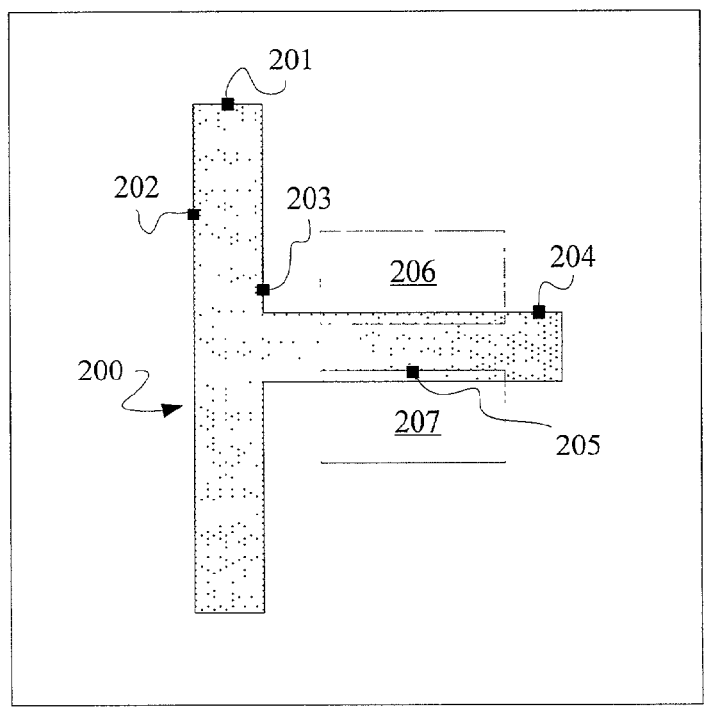
FIG. 2 illustrates a feature including a line end control point, an edge control point, an inner corner control point, an outer corner control point, and a phase shift mask gate control point.

At least four types of control points are designated in one embodiment: line end, edge, inner corner, and outer corner. FIG. 2 illustrates a feature 200 including a line end control point 201, an edge control point 202, an inner corner control point 203, and an outer corner control point 204. In one embodiment, information regarding another layout can be used to characterize additional control points. For example, a phase shifting layout including shifters 206 and 207 can be used in combination with a trim layout including feature 200 to characterize a phase shifting mask (PSM) gate control point 205. Note that in this embodiment PSM control point 205 is provided on an edge of shifter 207 on the phase shifting layout. In other embodiments, PSM control point 205 can be provided on an edge of feature 200 on the trim layout.

Each type of control point can be further characterized by assigning it a rule identification. For example, edge type control points can be divided into groups by a feature width w (measured perpendicular from an edge, typically at the control point, to the next edge of the feature). In one embodiment, the edge type control points can be divided into four groups as follows:

```
set   EdgeRuleTable {
         {"100<=w<200" 1}
         {"200<=w<300" 2}
         {"300<=w<400" 3}
         {"400<=w<max" 4}
       }
```

Thus, edge type control points having an associated feature width between 100 nm and 199 nm can be assigned a rule identification designation "1"; edge type control points having an associated feature width between 200 nm and 299 nm can be assigned a rule identification designation "2"; edge type control points having an associated feature width between 300 nm and 399 nm can be assigned a rule identification designation "3"; and edge type control points having an associated feature width greater than 400 nm can be assigned a rule identification designation "4". The rule identifications can be programmed by a user or set automatically by the dissection module.

The type and rule identification designations for each control point can be stored in a database. In one embodiment, the database can be accessed using the structured query language (SQL). This SQL database could be provided on a workstation or on a PC.

In addition to the type and rule identification designations, a control point can also be characterized by a user-specified tolerance. The user could input the tolerance by using a graphical user interface (GUI) provided by the dissection module or by using another input method (such as via a technology file or a script). A tolerance could apply globally to all control points, to specific types of control points, to specific groups of control points (by rule identification), or to individual control points. For example, the code below gives densely populated regions (i.e. regions on the layout having a small spacing s between features) a smaller tolerance than less densely populated regions.

```
set   EdgeToleranceTable={
         {"100<=s<200" 3}
         {"200<=s<max" 10}
       }
```

Thus, for an edge control point in a region having spacing between 100 nm and 199 nm the tolerance is 3 nm, whereas for an edge control point in another region having spacing greater than 200 nm the tolerance is 10 nm. Generally, the smaller the spacing between features the greater the need for printing accuracy to ensure that the user-desired functionality can be provided. Hence, the tolerance for control points in densely populated regions is typically set smaller than the tolerance for control points in less densely populated regions.

If the deviation of a control point is greater than its tolerance (as determined by simulation module 102), then the deviation of this control point can be written to the database. Of importance, the actual magnitude of the deviation as well its the direction (wherein "+" indicates a deviation outside the feature as defined by the original layout and a "−" indicates a deviation inside the feature) can be written to the database. Note that in current simulation tools the presence and location of the deviation can be accessed. However, the user is unable to access more in-depth information to facilitate more useful simulation results.

Because users tend to set tight tolerances, the database would typically store information regarding a significant subset of the control points in the layout. In this the manner, the time-consuming step of simulation need only be performed once to provide the information needed to generate the multitude of reports that could later be requested by the user. In accordance with one feature of the invention, the detailed control point information stored in the database allows the simulation tool to generate flexible and dynamic reporting of the simulation results.

In one embodiment, if the deviation of a control point is within tolerance, then further attributes of that checking point are not written to the database. However, the control point can still be included in the calculation of statistics, such as the mean and standard deviation (described in reference to FIG. 4).

Note that a user can specify zero-tolerance and later specify query conditions for reporting module 103. However, because the number of control points can be huge (e.g. in the range of 10–100 million for a medium-sized layout), specifying zero-tolerance for a layout can result in significant data volume, which in turn can reduce database query efficiency. In one embodiment, if the user-specified tolerance for a control point is set greater than a global variable, e.g. a default value of 100 nm, then that control point can be disabled.

In one embodiment, a user can also specify a target parameter for each checking point. A target is the distance of the actual control point from the edge in a perpendicular direction. Note that the target, which defines the ideal contour position, could be either inside or outside the feature. In a typical embodiment, the target parameter is set to zero. Like tolerances, target parameters could apply globally to all control points, to specific types of control points, to specific groups of control points (by rule identification), or to individual control points.

Simulation Module

Simulation module 102 performs simulations on the control points generated by dissection module 101, identifies any deviations of the control points, and writes those deviations to a database if the deviations are greater than the set tolerances. Note that the simulation tool can also accept a variety of different types of models. After simulation is complete, simulation module 102 can organize the information in the database into various tables to facilitate reporting.

In one embodiment, these tables can include a main table, a statistics table, and a cell table.

FIG. 3 illustrates an exemplary main table 300 in which each row corresponds to a control point whose deviation is greater than the tolerance. Thus, in FIG. 3, control points 301, 302, 303, and 304 have deviations greater than the set tolerances for those points. The columns in main table 300 can include, for example, cell name, type, rule identification, location (e.g. x and y coordinates), deviation (e.g. in nanometers), and the angle along which the deviation is defined.

The statistics table includes information that can be used to calculate and/or provide the mean (average) deviation and the standard deviation for any selected group of control points. FIG. 4 illustrates an exemplary statistics ("stat") table 400 in which the selected group of control points could be in a cell, of a specific type (e.g. line end control points), and designated by a rule identification (e.g. edge control points with features having a width between 100 nm and 199 nm). The columns in stat table 400 could include, for example, a mean (i.e. an average deviation for the cell, type, and rule identification), a sum of the squares of deviations (an intermediate step in determining the variance), a variance (i.e. an average of the squares of the deviations of the deviations about the mean), and a standard deviation (i.e. the positive square root of the variance, thereby providing a measure of variability in nanometers).

FIG. 5 illustrates an exemplary cell table 500, which provides information regarding specific cells in the layout. In cell table 500, information regarding the number of control points and the simulation time for those control points is provided for cells 501, 502, and 503. Other information could include, for example, the number of reported errors for each cell.

Reporting Module

Reporting module 103 can be used to extract useful information from the simulation results. In accordance with one feature of the invention, because detailed information regarding the deviations can be kept in the database, reporting can be done any time after the one-time simulation. The reporting operation can include two steps: data extraction and data output.

Data extraction allows users to focus on a subset of the dissection and simulation information stored in the database. In one embodiment, checking parameters can be used to access the information. For example, if the information is organized as tables (see FIGS. 3–5), then a user can access information using a first set of checking parameters corresponding to rows and/or columns in the database. Advantageously, the user can access other information using a second set of checking parameters corresponding to other rows and/or columns in the database without repeating the steps of dissecting the edges, simulating the control points, and storing of the information. In one embodiment, the data extraction step can create a temporary table to store information designated by the checking parameters. This temporary table can be a subset any table or a combination of multiple table subsets.

In one embodiment, layout hierarchy is not taken into consideration during the data extraction step. Thus, for example, if a user gives a condition like cell=502, only control points in cell 502 will be stored in the temporary table. In other words, points in other cells, including child cells of cell 502, will not be stored in the temporary table. In one embodiment, reporting module 103 can use SQL commands to perform this data extraction.

In the data output step, the user-requested simulation information in the temporary table can be manipulated in various formats to provide optimal reporting to the user. Note that using the temporary table instead of the main table can significantly reduce access/manipulation time because the temporary table typically includes significantly fewer entries than the main table. Advantageously, if a user wants to change the contents of the temporary table, the user can return to the data extraction step and provide different extraction conditions.

In one embodiment, the user can choose one or more modes for viewing the extracted information. Exemplary viewing modes can include a sequential browse mode, a view by area mode, a histogram mode, an error count mode, and a GDS mode. In the sequential browse mode, a user can access records in the temporary table one by one using a browser. The browser could be implemented using the CATS™ or IC-Workbench™ tools licensed by Numerical Technologies, Inc. In one embodiment, the browser can graphically display an error mark, such as cross or black square, on a reference layout to indicate the location of the control point associated with the accessed record. Note that the reference layout is preferably the original layout provided by the user rather than any modified layouts actually used in simulation. For example, in one embodiment, the modified layout includes optical proximity correction (OPC), which could unnecessarily complicate review of the simulation results by the user. In another embodiment, the modified layout could be a combination of two layouts, e.g. a phase shifting layout and a trim layout, which could also complicate review.

In the view by area mode, a user can view all errors falling within a specific area of a cell (referenced in the industry as a sub-tree) by inputting the coordinates of the area and the cell name in which the coordinates are defined. The reporting module can return a list of points and their attributes (deviation, angle, etc.) for a user to view, wherein some points can come from the designated cell and other points can come from child cells of the designated cell. In another embodiment, instead of using coordinates, the user can use an input device, such as a mouse, to indicate the area of interest graphically on a layout displayed on a computer monitor.

Figure 6:
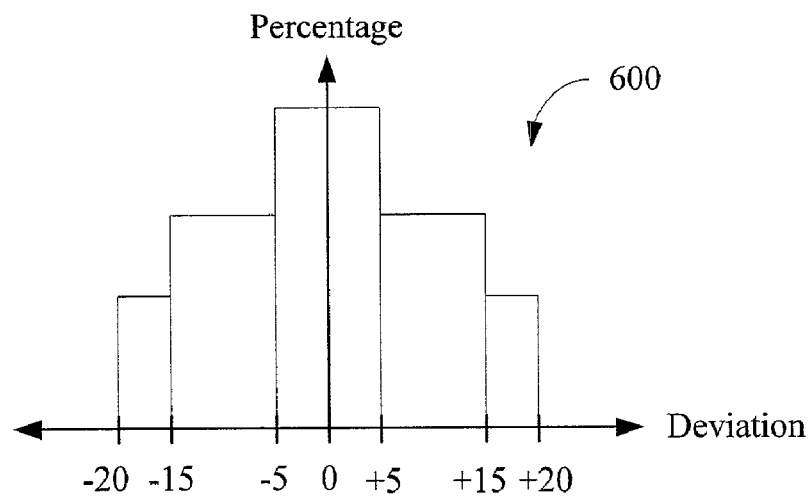
FIG. 6 illustrates an exemplary histogram, wherein the horizontal axis represents deviations from a layout edge and the vertical axis represents the percentage of control points having specific ranges of deviations.

In the histogram mode, the use can view deviation information in a specialized graph. FIG. 6 illustrates an exemplary histogram 600, wherein the horizontal axis represents deviations (+/−) from a layout edge (an independent variable) and the vertical axis represents the percentage of control points having specific ranges of deviations (the dependent variable). Note that the independent variable attains a finite number of discrete values, whereas the dependent variable can span a continuous range.

This mode can be particularly desirable because a histogram can quickly indicate the presence of a design or process problem. Specifically, if the histogram is not centered at zero, then the design and/or input parameters may be flawed. For example, the user may have inadvertently input a wrong number into a rule while performing rule-based OPC, thereby adversely affecting the results. In an ideal histogram, minor deviations are evenly distributed about zero, thereby indicating an optimized layout.

In the error count mode, the user can choose to query how many errors are in a specific cell. In one embodiment, the error counts include those in the child cells for that specific cell.

Figure 7:
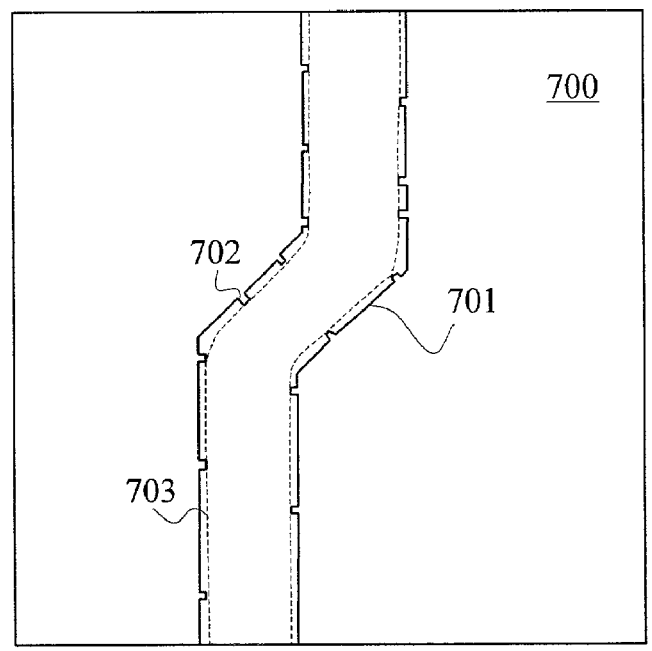
FIG. 7 illustrates an exemplary GDS output including a feature from an original GDS layout merged with a contour, which graphically represents the results of simulating that feature.

In the GDS mode, the records in the database can be converted into a GDS format and then merged with the original GDS file. For example, FIG. 7 illustrates an exemplary GDS output 700 including a feature 701 from the original GDS layout. In one embodiment, the control points can be indicated using notches 702 on feature 701. The contour 703 (dotted lines) graphically represents the results of simulating feature 701. In one embodiment, the depth of notches 702 is directly correlated to the amount of deviation. Thus, for example, contour 703 abuts notches 702 in GDS output 700.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. Note that the system and methods described herein can be applied to any lithographic process technologies, including ultraviolet, deep ultraviolet (DUV), extreme ultraviolet (EUV), x-ray, and e-beam. Accordingly, it is intended that the scope of the invention be defined by the following claims and their equivalents.

The invention claimed is:

1. A method of generating reports regarding an integrated circuit layout, the method comprising:
    providing a plurality of control points associated with the integrated circuit layout;
    performing a single simulation of the plurality of control points;
    storing information from the single simulation in a database, wherein the information includes deviation information for at least one control point, the deviation information indicating a deviation of a simulated location from a corresponding location on the integrated circuit layout; and
    extracting a subset of information from the database to generate the reports using a first set of checking parameters, wherein extracting is repeatable with a second set of checking parameters without repeating the steps of providing, performing, and storing.

2. The method of claim 1, wherein providing the plurality of control points includes designating at least one of a type, a rule identification, a tolerance, and a target parameter for each control point.

3. The method of claim 1, wherein storing information includes organizing the information in at least one of a main table, a statistics table, and a cell table.

4. The method of claim 1, wherein extracting the subset of information includes creating a temporary table for the subset of information, wherein the temporary table is separate from the database.

5. The method of claim 1, wherein extracting the subset of information includes viewing the subset of information in at least one of a sequential browse mode, a view by area mode, a histogram mode, an error count mode, and a Graphics Data Syntax (GDS mode).

6. The method of claim 1, further including providing at least one new rule associated with the plurality of control points and storing new information in the database based on the at least one new rule and the single simulation.

7. A method of generating simulation reports regarding an integrated circuit layout, the method comprising:
    dissecting feature edges on the integrated circuit layout into segments, each segment including a control point;
    performing a single simulation of the integrated circuit layout using the control points;

storing simulation information in a database, wherein the simulation information includes deviation information for at least one control point, the deviation information indicating a deviation of a simulated location from a corresponding location on the integrated circuit layout; and extracting user-identified information from the database to generate the simulation reports.

8. The method of claim 7, further including designating at least one of a type, a rule identification, a tolerance, and a target parameter for each control point.

9. The method of claim 7, wherein storing simulation information includes organizing information in at least one of a main table, a statistics table, and a cell table.

10. The method of claim 7, wherein extracting user-identified information includes creating a temporary table for user-identified information, wherein the temporary table is separate from the database.

11. The method of claim 7, wherein extracting user-identified information includes viewing the user-identified information in at least one of a sequential browse mode, a view by area mode, a histogram mode, an error count mode, and a Graphics Data Syntax (GDS mode).

12. The method of claim 7, further including providing at least one new rule associated with the control points and storing new information in the database based on the at least one new rule and the single simulation.

13. An apparatus for generating reports regarding an integrated circuit layout, the apparatus comprising:

means for providing a plurality of control points associated with the integrated circuit layout;

means for performing a single simulation of the plurality of control points;

means for storing information from the single simulation in a database, wherein the information includes deviation information for at least one control point, the deviation information indicating a deviation of a simulated location from a corresponding location on the integrated circuit layout; and means for extracting a subset of information from the database to generate the reports using a first set of checking parameters, wherein extracting is repeatable with a second set of checking parameters without repeating the steps of providing, performing, and storing.

14. The apparatus of claim 13, wherein the means for providing the plurality of control points includes means for designating at least one of a type, a rule identification, a tolerance, and a target parameter for each control point.

15. The apparatus of claim 13, wherein the means for storing information includes means for organizing the information in at least one of a main table, a statistics table, and a cell table.

16. The apparatus of claim 13, wherein the means for extracting the subset of information includes means for creating a temporary table for the subset of information, wherein the temporary table is separate from the database.

* * * * *